United States Patent
Peng et al.

(10) Patent No.: US 7,956,641 B1
(45) Date of Patent: Jun. 7, 2011

(54) LOW VOLTAGE INTERFACE CIRCUIT

(75) Inventors: Tao Peng, Nashua, NH (US); Xiaohu Zhang, Starkville, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 184 days.

(21) Appl. No.: 11/380,333

(22) Filed: Apr. 26, 2006

Related U.S. Application Data

(60) Provisional application No. 60/675,762, filed on Apr. 28, 2005.

(51) Int. Cl.
*H03K 19/094* (2006.01)
(52) U.S. Cl. .............. 326/62; 326/63; 326/81; 327/333; 327/57
(58) Field of Classification Search .............. 326/62–68, 326/80, 81–83, 86–87, 93, 95, 112, 121; 327/51–57, 65, 90, 96, 199–215, 227–229, 327/333, 427, 437
See application file for complete search history.

(56) References Cited

U.S. PATENT DOCUMENTS

| | | | |
|---|---|---|---|
| 4,096,402 A | 6/1978 | Schroeder et al. | |
| 4,150,308 A | 4/1979 | Adlhoch | |
| 4,178,558 A | 12/1979 | Nagashima et al. | |
| 4,264,872 A | 4/1981 | Suzuki | |
| 4,288,804 A | 9/1981 | Kikuchi et al. | |
| 4,397,003 A | 8/1983 | Wilson et al. | |
| 4,475,050 A | 10/1984 | Noufer | |
| 4,669,063 A | 5/1987 | Kirsch | |
| 4,771,194 A | 9/1988 | Zeghbroeck | |
| 4,943,738 A | 7/1990 | Hoshi | |
| 4,954,992 A | 9/1990 | Kumanoya et al. | |
| 4,973,864 A * | 11/1990 | Nogami | 327/55 |
| 4,978,870 A | 12/1990 | Chen et al. | |
| 5,029,137 A | 7/1991 | Hoshi | |
| 5,113,097 A | 5/1992 | Lee | |
| 5,130,581 A * | 7/1992 | Oh et al. | 327/55 |
| 5,148,399 A | 9/1992 | Cho et al. | |
| 5,175,450 A | 12/1992 | Chern | |
| 5,300,832 A | 4/1994 | Rogers | |
| 5,327,379 A | 7/1994 | Pascucci | |
| 5,349,305 A | 9/1994 | Hsiao et al. | |
| 5,396,467 A | 3/1995 | Liu et al. | |
| 5,412,348 A | 5/1995 | Kasha et al. | |
| 5,440,162 A | 8/1995 | Worley et al. | |
| 5,477,497 A * | 12/1995 | Park et al. | 365/205 |
| 5,539,334 A | 7/1996 | Clapp et al. | |
| 5,650,971 A * | 7/1997 | Longway et al. | 365/207 |
| 5,698,993 A * | 12/1997 | Chow | 326/81 |

(Continued)

OTHER PUBLICATIONS

U.S. Appl. No. 10/964,040 entitled "Level Shifting Input Buffer Circuit," filed Oct. 13, 2004.

(Continued)

*Primary Examiner* — James H. Cho
*Assistant Examiner* — Christopher Lo

(57) ABSTRACT

An improved interface circuit is provided herein for translating a relatively high input voltage into a relatively low output voltage using only low voltage transistors and a single, low voltage power supply. According to one embodiment, the interface circuit includes a power supply, a pair of input transistors with source terminals coupled together for receiving a relatively low voltage from the power supply, and a current sense amplifier with a pair of input terminals, each coupled to a drain terminal of a different one of the pair of input transistors for receiving a pair of differential currents and for generating a pair of differential voltages therefrom.

18 Claims, 4 Drawing Sheets

U.S. PATENT DOCUMENTS

| | | | |
|---|---|---|---|
| 5,701,268 | A | 12/1997 | Lee et al. |
| 5,732,015 | A | 3/1998 | Kazerounian et al. |
| 5,737,260 | A | 4/1998 | Takata et al. |
| 5,742,183 | A | 4/1998 | Kuroda |
| 5,744,982 | A | 4/1998 | Chu |
| 5,821,800 | A | 10/1998 | Le et al. |
| 5,850,365 | A | 12/1998 | Reese et al. |
| 5,892,371 | A | 4/1999 | Maley |
| 5,942,921 | A | 8/1999 | Talaga, Jr. |
| 6,023,174 | A | 2/2000 | Kirsch |
| 6,052,324 | A | 4/2000 | Tobita |
| 6,061,267 | A | 5/2000 | Houston |
| 6,067,256 | A | 5/2000 | Yamashita et al. |
| 6,069,515 | A | 5/2000 | Singh |
| 6,115,309 | A | 9/2000 | Coleman, Jr. |
| 6,137,319 | A * | 10/2000 | Krishnamurthy et al. ...... 327/51 |
| 6,147,540 | A | 11/2000 | Coddington |
| 6,184,738 | B1 | 2/2001 | Iwamoto et al. |
| 6,240,027 | B1 * | 5/2001 | Lee et al. ................. 365/189.11 |
| 6,271,707 | B1 | 8/2001 | Le et al. |
| 6,275,070 | B1 | 8/2001 | Pantelakis et al. |
| 6,292,025 | B1 | 9/2001 | Okumura |
| 6,314,028 | B1 | 11/2001 | Kono |
| 6,331,791 | B1 | 12/2001 | Huang |
| 6,370,072 | B1 | 4/2002 | Dennard et al. |
| 6,396,310 | B2 | 5/2002 | Shin |
| 6,400,189 | B2 | 6/2002 | McDaniel |
| 6,411,559 | B1 * | 6/2002 | Yokozeki ....................... 365/205 |
| 6,411,560 | B1 | 6/2002 | Tanizaki et al. |
| 6,414,534 | B1 | 7/2002 | Wang et al. |
| 6,430,095 | B1 | 8/2002 | Casper |
| 6,449,202 | B1 | 9/2002 | Akatsu et al. |
| 6,480,037 | B1 | 11/2002 | Song et al. |
| 6,483,349 | B2 | 11/2002 | Sakata et al. |
| 6,483,386 | B1 | 11/2002 | Cress et al. |
| 6,501,306 | B1 | 12/2002 | Kim et al. |
| 6,501,696 | B1 | 12/2002 | Mnich et al. |
| 6,518,790 | B2 | 2/2003 | Wada et al. |
| 6,535,019 | B2 | 3/2003 | De Santis |
| 6,552,569 | B2 | 4/2003 | Wert |
| 6,586,984 | B1 | 7/2003 | Radke |
| 6,611,157 | B2 | 8/2003 | Usui |
| 6,614,266 | B2 * | 9/2003 | Ishii et al. ........................ 326/98 |
| 6,617,885 | B2 * | 9/2003 | Lim et al. ........................ 327/57 |
| 6,671,201 | B2 | 12/2003 | Masuda |
| 6,762,961 | B2 | 7/2004 | Eleyan et al. |
| 6,774,673 | B2 | 8/2004 | Tsuboi et al. |
| 6,784,700 | B1 | 8/2004 | Hunt et al. |
| 6,784,717 | B1 | 8/2004 | Hunt et al. |
| 6,785,107 | B1 | 8/2004 | Schmitt |
| 6,788,125 | B1 | 9/2004 | Tomsio |
| 6,801,064 | B1 | 10/2004 | Hunt et al. |
| 6,819,137 | B1 * | 11/2004 | Wang et al. ..................... 326/68 |
| 6,829,171 | B2 | 12/2004 | Ooishi |
| 6,836,155 | B2 * | 12/2004 | Shim ............................... 327/55 |
| 6,859,409 | B2 * | 2/2005 | Hwang ..................... 365/230.03 |
| 6,888,381 | B2 | 5/2005 | Momtaz et al. |
| 6,940,318 | B1 | 9/2005 | Wong |
| 6,946,882 | B2 | 9/2005 | Gogl et al. |
| 7,038,963 | B2 * | 5/2006 | Lee ................. 365/207 |
| 7,106,123 | B2 * | 9/2006 | Kanno et al. .................. 327/333 |
| 7,151,391 | B2 * | 12/2006 | Chen et al. ....................... 326/68 |
| 7,167,027 | B2 * | 1/2007 | Matsuo et al. .................. 327/57 |
| 7,276,953 | B1 * | 10/2007 | Peng et al. ...................... 327/333 |
| 7,616,513 | B1 | 11/2009 | Peng et al. |
| 2003/0006801 | A1 * | 1/2003 | Brownlow et al. .............. 326/81 |
| 2003/0201800 | A1 * | 10/2003 | Matsuo et al. ................... 327/57 |

OTHER PUBLICATIONS

U.S. Appl. No. 11/262,412 entitled "Memory Device, Current Sense Amplifier, and Method of Operating the Same," filed Oct. 28, 2005.
USPTO Notice of Allowance for U.S. Appl. No. 10/964,040 dated May 18, 2007; 6 pages.
USPTO Advisory Action for U.S. Appl. No. 10/964,040 dated Apr. 18, 2007; 3 pages.
USPTO Final Rejection for U.S. Appl. No. 10/964,040 dated Feb. 9, 2007; 9 pages.
USPTO Non-Final Rejection for U.S. Appl. No. 10/964,040 dated Sep. 5, 2006; 8 pages.
USPTO Advisory Action for U.S. Appl. No. 10/964,040 dated Jul. 27, 2006; 3 pages.
USPTO Final Rejection for U.S. Appl. No. 10/964,040 dated May 8, 2006; 7 pages.
USPTO Non-Final Rejection for U.S. Appl. No. 10/964,040 dated Dec. 23, 2005; 14 pages.
USPTO Notice of Allowance for U.S. Appl. No. 11/262,412 dated Jun. 26, 2009; 6 pages.
USPTO Notice of Allowance for U.S. Appl. No. 11/262,412 dated Mar. 9, 2009; 8 pages.
USPTO Non-Final Rejection for U.S. Appl. No. 11/262,412 dated Sep. 26, 2008; 18 pages.
USPTO Advisory Action for U.S. Appl. No. 11/262,412 dated Jun. 30, 2008; 3 pages.
USPTO Final Rejection for U.S. Appl. No. 11/262,412 dated Apr. 7, 2008; 19 pages.
USPTO Non-Final Rejection for U.S. Appl. No. 11/262,412 dated Sep. 11, 2007; 16 pages.
USPTO Advisory Action for U.S. Appl. No. 11/262,412 dated Aug. 6, 2007; 3 pages.
USPTO Final Rejection for U.S. Appl. No. 11/262,412 dated May 15, 2007; 14 pages.
USPTO Non-Final Rejection for U.S. Appl. No. 11/262,412 dated Oct. 23, 2006; 12 pages.
USPTO Notice of Allowance for U.S. Appl. No. 10/870,289 dated Aug. 1, 2007; 4 pages.
USPTO Non-Final Rejection for U.S. Appl. No. 10/870,289 dated Feb. 21, 2007; 6 pages.
USPTO Non-Final Rejection for U.S. Appl. No. 10/870,289 dated Oct. 19, 2006; 7 pages.
USPTO Non-Final Rejection for U.S. Appl. No. 10/870,289 dated Jun. 8, 2006; 8 pages.
USPTO Non-Final Rejection for U.S. Appl. No. 10/870,289 dated Jan. 10, 2006; 8 pages.
USPTO Non-Final Rejection for U.S. Appl. No. 10/870,289 dated Aug. 1, 2005; 7 pages.
Sinha et al., "High-Perfornace and Low-Voltage Sense-Amplifier Techniques for Sub-90nm SRAM," 2003 IEEE, pp. 113-116.
USPTO Notice of Allowance for U.S. Appl. No. 10/229,481 dated Apr. 15, 2004; 7 pages.
USPTO Final Rejection for U.S. Appl. No. 10/229,481 dated Feb. 19, 2004; 7 pages.
USPTO Non-Final Rejection for U.S. Appl. No. 10/229,481 dated Oct. 17, 2003; 6 pages.
USPTO Non-Final Rejection for U.S. Appl. No. 09/676,539 dated Aug. 21, 2001; 5 pages.
USPTO Non-Final Rejection for U.S. Appl. No. 10/229,481 dated May 5, 2003; 6 pages.
USPTO Requirement for Restriction/Election for U.S. Appl. No. 10/229,481 dated Apr. 4, 2003; 5 pages.
USPTO Notice of Allowance for U.S. Appl. No. 10/228,436 dated Mar. 18, 2004; 6 pages.
USPTO Non-Final Rejection for U.S. Appl. No. 10/228,436 dated Nov. 13, 2003; 6 pages.
USPTO Advisory Action for U.S. Appl. No. 10/228,436 dated Oct. 8, 2003; 3 pages.
USPTO Final Rejection for U.S. Appl. No. 10/228,436 dated Jul. 16, 2003; 8 pages.
USPTO Non-Final Rejection for U.S. Appl. No. 10/228,436 dated Mar. 27, 2003; 9 pages.
USPTO Notice of Allowance for U.S. Appl. No. 10/233,696 dated Apr. 22, 2004; 7 pages.
USPTO Advisory Action for U.S. Appl. No. 10/233,696 dated Mar. 26, 2004; 3 pages.

USPTO Final Rejection for U.S. Appl. No. 10/233,696 dated Jan. 21, 2004; 9 pages.
USPTO Non-Final Rejection for U.S. Appl. No. 10/233,696 dated Oct. 3, 2002; 6 pages.
USPTO Notice of Allowance for U.S. Appl. No. 09/855,411 dated Aug. 8, 2002; 6 pages.

USPTO Notice of Allowance for U.S. Appl. No. 09/676,539 dated Jul. 15, 2002; 4 pages.
USPTO Non-Final Rejection for U.S. Appl. No. 09/676,539 dated Feb. 26, 2002; 5 pages.

* cited by examiner

US 7,956,641 B1

LOW VOLTAGE INTERFACE CIRCUIT

PRIORITY CLAIM

This application claims priority to U.S. Provisional Application No. 60/675,762 entitled "Low Voltage Interface Circuit," filed Apr. 28, 2005.

BACKGROUND OF THE INVENTION

1. Field of the Invention

This invention relates to interface circuit design and, more particularly, to an input buffer design including low voltage transistors and a single low voltage power supply.

2. Description of the Related Art

The following descriptions and examples are not admitted to be prior art by virtue of their inclusion within this section.

A current trend in integrated circuit (IC) design is that internal power supply levels continue to fall, while external power supply levels remain substantially unchanged. For example, extended high speed transistor logic (eHSTL) with voltage swings between about 0.0V and 1.8V is often used for inter-IC signaling, even though the IC's themselves may operate at significantly lower levels (e.g., about 1.2V to about 1.8V). To provide compatibility with higher power supply systems (such as those utilizing eHSTL), an interface circuit may be incorporated within an IC for translating higher voltage signals to lower voltage signals. For example, an interface circuit may include a voltage translator, level shift circuit or level clipping circuit, and may be placed in the signal path preceding an input buffer portion of the interface circuit.

To accommodate lower internal power supply voltages (e.g., about 1.45V and below), the input buffer portion may include a pair of low voltage input transistors, which are coupled together for receiving a relatively low voltage (e.g., about 1.45V) from a low voltage power supply. The pair of input transistors may also receive a high voltage input signal or a pair of high voltage input signals (e.g., 1.8V) from input pins or another integrated circuit. The input signals supplied to the pair of input transistors may be differential or single-ended, depending on design specifications. In some cases, a differential amplifier may be coupled to output nodes of the input transistors for generating an output voltage based on a comparative difference between the input signals supplied to the input transistors.

However, a problem often arises when a high voltage input signal (e.g., above about 1.45 V for CMOS process technologies) is supplied to a low voltage transistor. As used herein, a low voltage transistor may be generally described as having a thinner gate oxide and/or different source/drain doping than a high voltage transistor. In addition, low voltage transistors tend to be smaller than their high voltage counterparts and are typically optimized for operating within a lower voltage range (e.g., about 0.0V to 1.45V for CMOS), depending on the particular process technology used. Unlike high voltage transistors, which are optimized for operating within a higher voltage range (e.g., about 0.0V to about 1.8V for CMOS), low voltage transistors often experience some level of degradation when gate-to-drain (or gate-to-source) voltages exceed the upper threshold of the operating range (e.g., about 1.45V). In other words, gate voltages in excess of about 1.45V tend to overstress the thinner gate oxides of low voltage CMOS transistors, often resulting in gate oxide degradation or breakdown. Performance issues arise when the gate oxide begins to degrade, with circuit failure occurring when the gate oxide reaches breakdown.

Therefore, a need remains for an improved interface circuit capable of translating a relatively high external voltage into a relatively low internal voltage without experiencing gate oxide degradation or breakdown.

SUMMARY OF THE INVENTION

The problems outlined above may be in large part addressed by an improved interface circuit for converting a relatively high input voltage into a relatively low output voltage using only low voltage transistors and a single, low voltage power supply.

According to one embodiment, the interface circuit described herein may include a power supply, a pair of input transistors whose source terminals are coupled together for receiving a relatively low voltage from the power supply, and a current sense amplifier whose input terminals are coupled to drain terminals of the pair of input transistors for receiving a pair of differential currents therefrom. In some cases, the input transistors may be configured for generating the pair of differential currents in response to receiving the relatively high input voltage and a reference voltage (or complementary input voltage) at gate terminals thereof. The current sense amplifier may be configured for receiving the pair of differential currents and for generating a pair of differential voltages therefrom. In some cases, a voltage sense amplifier may be coupled for receiving the pair of differential voltages from the current sense amplifier and for generating the relatively low output voltage therefrom.

One unique aspect of the invention is the use of a current sense amplifier (ISA) within a low voltage interface circuit. For example, the current sense amplifier may be included within the interface circuit for clamping the voltage levels present at the drain terminals of the input transistors to a particular voltage level. By clamping the drain voltages to a relatively high level (e.g., about 1.0V or above), the current sense amplifier may (i) avoid gate oxide degradation/breakdown of the low voltage transistors contained within the interface circuit, and (ii) eliminate the need for inserting a level clipping circuit (including, e.g., high voltage transistors and high voltage power supplies) within the signal path between an input node of the interface circuit and the low voltage input transistors. The current sense amplifier, therefore, enables a highly robust, low voltage interface circuit to be provided herein for converting a relatively high input voltage into a relatively low output voltage using only low voltage transistors and a single, low voltage power supply.

In general, low voltage transistors may be formed with thinner gate oxides and/or different source/drain dopants and/or concentrations than high voltage transistors. Low voltage transistors may also be somewhat smaller than their high voltage counterparts. As such, low voltage transistors may be optimized for operating within a relatively lower voltage range than high voltage transistors of the same process technology. In some embodiments, a low voltage transistor may be described as one, which is configured for operating within a relatively low voltage range of about 0.0V to about 1.8V (for older CMOS process technologies), or about 0.0V to about 1.45V (for new CMOS process technologies). However, the designation of high and low operating voltages is process dependent and, therefore, may vary in other embodiments of the invention. Regardless, including only low voltage transistors within the interface circuit enables the circuit to be adequately supplied with a single, low voltage power supply (e.g., about 1.45V and below) and avoids the design difficulties typically involved in multiple power supply systems.

BRIEF DESCRIPTION OF THE DRAWINGS

Other objects and advantages of the invention will become apparent upon reading the following detailed description and upon reference to the accompanying drawings in which.

Figure 1:
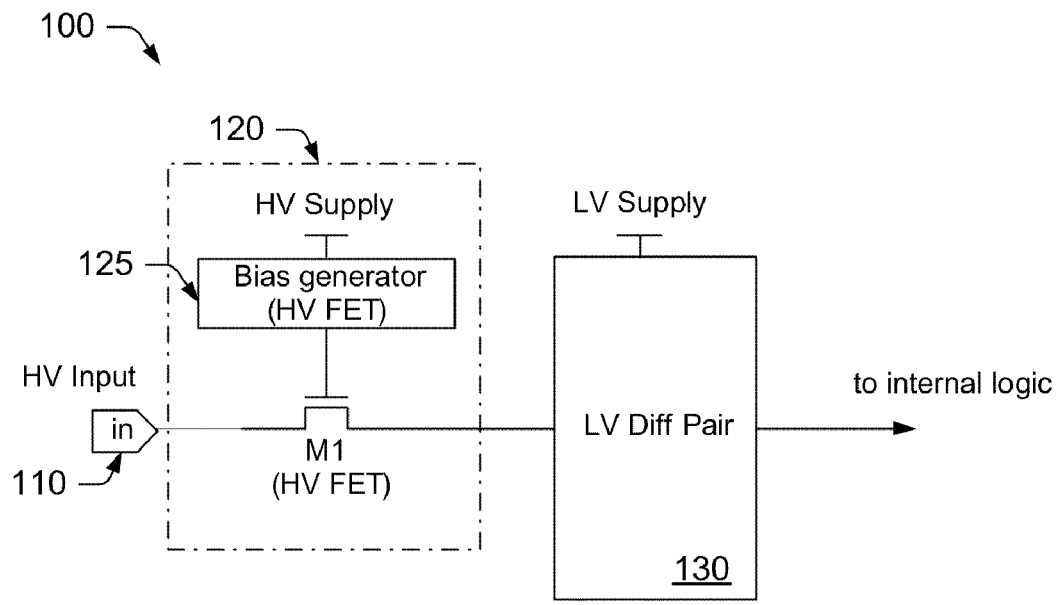
FIG. 1 is a block diagram of an exemplary interface circuit design.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates one embodiment of an interface circuit 100 in which a level clipping circuit 120 is arranged within the signal path between an input node 110 and buffer portion 130 of the interface circuit. To accommodate relatively low internal power supply levels (e.g., below about 1.45V), buffer portion 130 may typically include a pair of low voltage transistors (not shown in FIG. 1). In some cases, the low voltage transistors may be arranged as a differential pair for receiving an input signal and a reference signal (in the case of a single-ended interface circuit) or a pair of complementary input signals (in the case of a differential interface circuit).

As used herein, transistors designated as low voltage may be somewhat smaller than so-called high voltage transistors, and may be formed with substantially thinner gate oxides and/or different source/drain dopants (and/or concentrations). As such, low voltage transistors may operate within a relatively lower voltage range than high voltage transistors of the same process technology. For example, low voltage CMOS transistors may be optimized for operating within a relatively low voltage range of about 0.0V to about 1.45V (for newer technology) or about 0.0V to about 1.8V (for older technology). On the other hand, high voltage CMOS transistors may be optimized for operating within a relatively high voltage range of about 0.0V to about 1.8V (for newer technology) about 0.0V to about 3.3V (for older technology).

For the sake of brevity, the interface circuits described herein are implemented with 90 nm Complementary Metal Oxide Semiconductor (CMOS) process technology. In many cases, the transistors included within the interface circuits may operate according to the relatively high and relatively low voltage ranges provided above. However, because the designation of high and low operating voltages is process dependent and subject to changes as technology advances, the voltage ranges provided above may be somewhat different, in other embodiments of the invention. For example, if the interface circuits described herein were alternatively implemented with 0.13 μm CMOS process technology, the transistors included within the interface circuits could operate within a low voltage range of about 0.0V to about 1.2V, or a high voltage range of about 0.0V to about 2.5V.

In general, level clipping circuit 120 may be included within interface circuit 100 to avoid the gate oxide degradation/breakdown, which may occur when a high voltage input signal (e.g., above about 1.45 V) is supplied to the gate terminal of a low voltage transistor (such as those included within buffer portion 130). According to one embodiment, level clipping circuit 120 may insert a high voltage NMOS transistor (M1) between input node 110 and buffer portion 130 for "clipping off" the high voltage portion of the input waveform. In other words, voltage clipping may be used in the embodiment of FIG. 1 to ensure that the voltage level of the input signal entering buffer portion 130 will not overstress the gate oxide of the low voltage transistors contained therein. The amount of clipping generally depends on the gate voltage supplied to transistor M1.

For example, the gate voltage supplied to transistor M1 may be controlled by a bias generator (125), as shown in FIG. 1. In some cases, bias generator 125 may comprise a voltage divider circuit, a band gap reference circuit, or substantially any other circuit element (or combination of circuit elements) capable of generating a particular bias voltage. As described in more detail below, the bias voltage supplied to transistor M1 may avoid gate oxide degradation and breakdown of the low voltage transistors contained within buffer portion 130 by reducing the voltage level of the input signal supplied thereto.

Although level clipping circuit 120 may successfully avoid gate oxide degradation and breakdown, level clipping circuit 120 generally complicates the design process by requiring an additional power supply to be included within the IC layout. For example, level clipping circuit 120 may utilize one or more high voltage transistors, which have been optimized for operation within a relatively high voltage range of about 0.0V to about 1.8V. In most cases, use of the high voltage transistors requires an additional high voltage power supply (HV Supply) and additional routing to be included for supplying power to level clipping circuit 120.

For example, a relatively high power supply level may be routed from a high voltage power supply pin on the periphery of the IC to level clipping circuit 120. Level clipping circuit 120 may then translate the relatively high power supply level into an appropriate control signal (or bias voltage). For example, a bias generator (125) comprising one or more high voltage transistors may be included within level clipping circuit 120 for generating a relatively high voltage control signal. In some cases, the control signal may be supplied to the gate terminal of high voltage transistor M1, as shown in FIG. 1. In this manner, the control signal may be used for reducing or clipping the voltage level of the input signal supplied to the drain terminal of transistor M1.

As noted above, a high voltage transistor may be formed with a thicker gate oxide (and/or different source/drain doping) so that substantially higher voltage levels may be supplied to its gate terminal without overstressing its gate oxide. By inserting a high voltage transistor (M1) between high voltage input pin 110 and buffer portion 130, level clipping circuit 120 reduces the voltage level generated at the source terminal of transistor M1 when a high voltage input signal (Vin) is supplied to the drain terminal of transistor M1. In some cases, the voltage level generated at the source terminal of transistor M1 may be low enough to avoid gate oxide degradation/breakdown of the low voltage transistors included within buffer portion 130.

Unfortunately, level clipping circuit 120 presents many problems for the circuit designer. For example, level clipping circuit 120 requires the use of high voltage transistors, which may be formed with a thicker gate oxide and/or different source/drain doping than a corresponding low voltage transistor. As such, high voltage transistors are typically placed in different diffusion regions (i.e., wells) on the semiconductor substrate, and may also occupy more space than low voltage transistors. The use of high voltage PMOS transistors may be particularly undesirable in CMOS circuits, due to the tendency for high voltage PMOS transistors to be twice as large as high voltage NMOS transistors.

Another problem lies in the fact that level clipping circuit 120 requires an additional high voltage power supply and additional power routing for operating the high voltage transistors contained therein. In addition to potential routing congestion, dual voltage devices (i.e., those including two power supplies) often suffer from concerns related to power sequencing (e.g., the order, rate, etc. at which power is supplied to the device). In other words, a multiple power supply IC may have additional latch-up susceptibility and/or complexity in establishing logic states. Further, power sequencing typically demands a particular order, which simply adds to the complexity of start-up operations for an electronic device containing the multiple power supply integrated circuit.

Figure 2:
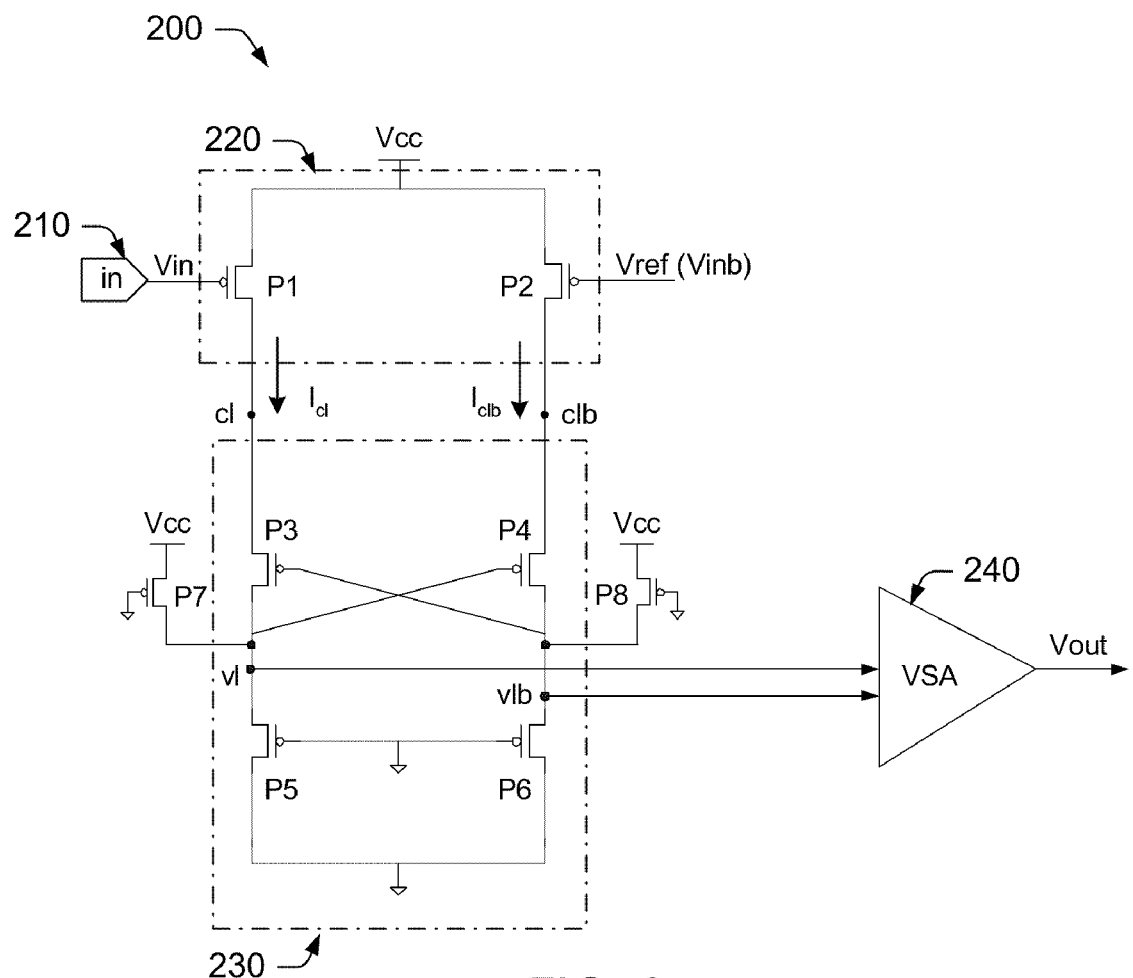
FIG. 2 is a block diagram of an exemplary interface circuit design, according to one embodiment of the invention.

FIG. 2 illustrates an improved interface circuit 200, in accordance with one embodiment of the invention. As shown in FIG. 2, interface circuit 200 may include a pair of low voltage P-channel input transistors (P1, P2) forming a buffer portion 220 of the interface circuit. Unlike interface circuit 100, at least one of the low voltage P-channel input transistors (P1 and/or P2) is directly coupled for receiving a high voltage input signal (Vin) from input node 210. In other words, interface circuit 200 eliminates the need for inserting a level clipping circuit (or any other voltage level modification means) within the signal path between input node 210 and buffer portion 220. Instead, interface circuit 200 provides an alternative means for avoiding gate oxide degradation/breakdown of low voltage transistors, thereby avoiding the problems and inconveniences typically associated with level clipping circuits (e.g., the need for high voltage transistors, additional power supplies and increased routing requirements).

In some cases, interface circuit 200 may be configured as a differential interface (not shown) or as a voltage-referenced single-ended interface, as shown in FIG. 2. Common voltage-referenced single-ended interface standards include Low Voltage CMOS (LVCMOS), Low Voltage Transistor-Transistor Logic (LVTTL), Stub Series Terminated Logic (SSTL) and High-Speed Transceiver Logic (HSTL). These standards may be used within an I/O interface (e.g., a receiver and/or transmitter) to transform inter-chip signal levels into internal signal levels, which are normally in the low voltage power supply domain.

The HSTL interface standard, in particular, is a standard that was developed by the Joint Electronic Device Engineering Committee (JEDEC) for voltage scalable and technology-independent I/O structures. The HSTL standard (or JEDEC standard No. 8-6) is a general-purpose, high-speed, 1.5V interface standard for digital integrated circuits. I/O structures governed by this standard generally include differential inputs (or one input internally tied to a user-supplied input reference voltage, $V_{REF}$, for single-ended inputs) and outputs using power supply voltages that are typically lower than a system-wide power supply. The power supply input (VCC) for an HSTL interface generally ranges between about 1.4 volts and about 1.6 volts. An extended version of the HSTL interface (referred to as "eHSTL") provides a wider operating range by extending the power supply voltage swing to about 1.8V. If a reference voltage ($V_{REF}$) is used, the reference voltage is often set to about VCC/2, with typical reference voltages ranging between about 0.68 volts and 0.90 volts. A particular reference voltage may be chosen to provide optimum noise margin. In this manner, the HSTL and eHSTL standards give circuit designers enhanced flexibility in optimizing system performance by providing an adjustable trip point ($V_{REF}$) and minimal switching range (i.e., about 0.0 volts to 1.5/1.8 volts), which provide faster outputs with reduced power dissipation and minimized EMI concerns.

In the description provided below, interface circuit 200 may be configured in accordance with a voltage-referenced, single-ended 1.5V or 1.8V HSTL interface standard. It is noted, however, that other single-ended or differential interface standards may be used in other embodiments of the invention. For example, common differential interface standards include Current Mode Logic (CML), Positive-Emitter Coupled Logic (PECL), Low-Voltage PECL (LVPECL), Low-Voltage Differential Signaling (LVDS), as well as Differential SSTL and Differential HSTL. Though not illustrated herein for the purpose of brevity, various aspects of the invention may be incorporated within a differential interface circuit to provide the circuit with enhanced noise rejection capabilities. For example, a pair of complementary input signals (Vin and Vin bar) may be supplied to the gate terminals of input transistors P1 and P2, instead of the input voltage signal (Vin) and reference voltage signal (Vref) mentioned below.

In the embodiment of FIG. 2, low voltage P-channel input transistors P1, P2 are respectively coupled for receiving an input voltage signal (Vin) and reference voltage signal (Vref), and for generating a pair of differential currents ($I_{cl}$ and $I_{clb}$) based on the relative difference between such signals. In some cases, the input voltage signal (Vin) may be a relatively high voltage signal received, e.g., from another integrated circuit. In one embodiment, the input voltage signal may be an extended HSTL signal with a relatively high voltage swing of about 0.0V to about 1.8V. To accommodate lower internal power supply levels (e.g., below about 1.45V), the relatively high voltage input signal (Vin) may be translated into a relatively low voltage output signal (Vout). In one embodiment, voltage translation may be performed in accordance with a 1.5V or 1.8V HSTL interface standard. However, one skilled in the art will understand how other relatively high input signals could be similarly translated into relatively low output signals in accordance with other interface standards.

The differential currents ($I_{cl}$ and $I_{clb}$) generated by low voltage input transistors P1, P2 are supplied to current sense amplifier 230. As shown in FIG. 2, current sense amplifier (ISA) 230 may include a pair of cross-coupled transistors P3, P4 with source terminals respectively coupled to the drain terminals of low voltage input transistors P1, P2. To configure the transistors as cross-coupled, the gate terminal of transistor P3 may be coupled to the drain terminal of transistor P4, and vice versa. The drain terminals of cross-coupled transistors P3, P4 may then be coupled to ground through load transistors P5, P6. In this manner, ISA 230 may be configured for converting the pair of differential currents ($I_{cl}$ and $I_{clb}$) into a pair of differential output voltages ($V_l$ and $V_{lb}$).

One unique aspect of the invention is the use of a current sense amplifier within a low voltage interface circuit. For example, current sense amplifier (ISA) 230 is included within interface circuit 200 for clamping the voltage levels present at the drain terminals of input transistors P1, P2 to a particular voltage level. However, the voltage clamping provided by ISA 230 should not be confused with the voltage clipping provided by level clipping circuit 120. While voltage clipping places a limit on the high side, voltage clamping limits the low side of the voltage waveform. This enables ISA 230 to limit the voltage drop across the gate terminals of input transistors P1, P2, thereby reducing the likelihood of overstressing the gate oxide of the input transistors. The voltage clamping feature of ISA 230 is described in more detail below in reference to FIG. 3.

Figure 3:
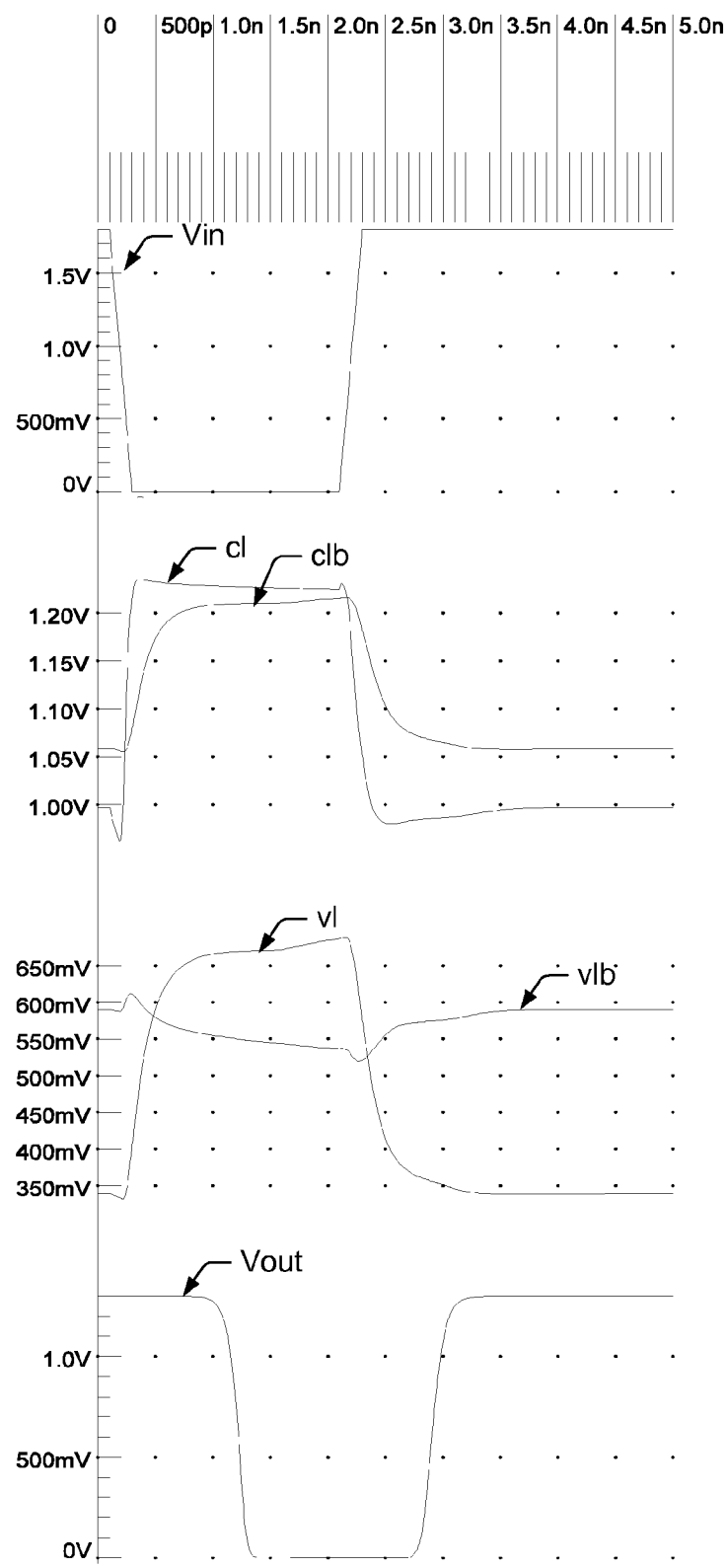
FIG. 3 is a simulation waveform illustrating various nodal voltages that may occur during operation of the interface circuit shown in FIG. 2.

FIG. 3 is graph illustrating exemplary simulation waveforms of the nodal voltages generated within interface circuit 200. In response to a high voltage input signal (Vin), a first pair of voltages are generated at the drain terminals of low voltage input transistors P1 and P2 (i.e., at nodes cl and clb). However, because the drain terminals of P1 and P2 are coupled to ISA 230, the voltage levels generated at nodes cl and clb may be restricted or clamped to about 1.0V and above, depending on the size (i.e., length and width) of cross-coupled transistors P3 and P4. In one example, transistors P3 and P4 may be sized so that the voltage levels generated at nodes cl and clb are respectively clamped to about 0.997V and about 1.058V, as shown in FIG. 3. The voltage clamping provided by ISA 230 decreases the maximum voltage drop across the gate terminals of the low voltage input transistors when a high swing input signal is supplied thereto, and therefore, reduces the probability of overstressing the input transistors.

More specifically, the maximum voltage drop across the gate terminals of input transistors P1, P2 may be limited to about 0.7-0.8V when receiving a high voltage 1.8V input high signal with 1.45V low voltage power supply (e.g., 1.8V−0.997V=0.803V; 1.8V−1.058V=0.742V). In other words, the maximum gate-to-drain voltage ($V_{GA}$) across input transistors P1, P2 may be clamped to a level (e.g., 0.7-0.8V), which is significantly less than the level (e.g., 1.45V) at which a low voltage transistor gate oxide becomes overstressed. Thus, gate oxide degradation and breakdown can be avoided by using ISA 230 to clamp the voltage at the drain terminals (i.e., nodes cl and clb) of the low voltage input transistors.

In order to clamp nodes cl and clb to a significantly high voltage, ISA 230 may be configured with a near zero input impedance. In one embodiment, a near zero input impedance may be provided by the relatively high transconductance (gm) of cross-coupled PMOS transistors P3, P4. In some cases, relatively weak pull-up transistors P7, P8 may be coupled between VCC and the drain terminals of cross-coupled transistors P3, P4 to ensure that the voltage levels present at nodes cl and clb do not significantly drop when the difference between the differential currents ($I_{cl}$ and $I_{clb}$) is reduced (e.g., when Vin is close to Vref).

In the embodiment of FIG. 2, the differential currents ($I_{cl}$ and $I_{clb}$) flowing into ISA 230 are converted into differential voltages ($V_l$ and $V_{lb}$) at the drain terminals of cross-coupled transistors P3, P4. In some cases, the comparative difference between the differential voltages may be small (e.g., on the order of 150 mV), as shown in FIG. 3. For this reason, a voltage sense amplifier (VSA) 240 may be used, in some embodiments of the invention, for amplifying the differential voltages and generating an output voltage (Vout) based on a comparison made therebetween. In some cases, VSA 240 may be configured for amplifying the comparative difference to CMOS voltage levels (e.g., about 0.0V to about 1.45V). However, VSA 240 may be alternatively configured for generating substantially different signal levels, in other embodiments of the invention.

An improved interface circuit is described herein as including a pair of low voltage input transistors (P1, P2) coupled to a low voltage power supply (VCC) for producing a pair of differential currents ($I_{cl}$ and $I_{clb}$), which are based on the relative difference between input signals (e.g., Vin and Vref, or Vin and Vin bar) supplied to the gate terminals of the low voltage input transistors. The pair of differential currents is converted into a pair of differential voltages ($V_l$ and $V_{lb}$) by coupling a current sense amplifier (ISA 230) to the drain terminals of the low voltage input transistors. In some embodiments, the differential voltages may be supplied to a voltage sense amplifier (VSA 240) for generating an output voltage (Vout) based on the comparative difference therebetween.

As one advantage, the improved interface circuit design eliminates the need for using high voltage transistors, and instead, uses only low voltage transistors. As shown in FIG. 2, for example, buffer portion 220 and ISA 230 may include only low voltage PMOS transistors. The ability to use low voltage transistors may be particularly useful in CMOS circuits, due to the relatively large size of high voltage PMOS transistors. Using only low voltage transistors may also produce a more highly compact IC design by eliminating the need for separate diffusion regions, larger spacing requirements between transistors, and the need for an additional high voltage power supply with additional routing.

Furthermore, the improved interface circuit design provides a unique means for avoiding the gate oxide degradation and breakdown that may otherwise occur when high swing input signals are supplied to low voltage transistors. In particular, the improved interface circuit design utilizes a current sense amplifier (e.g., ISA 230) for clamping the voltages generated at the drain terminals of the input transistors (P1, P2). By clamping the drain voltages to a relatively high level (e.g., about 1.0V), the current sense amplifier (i) avoids gate oxide degradation/breakdown of the low voltage transistors contained within the improved interface circuit, and (ii) eliminates the need for inserting a level clipping circuit (or any other voltage level modification means) within the signal path between the input node (210) and low voltage input transistors (P1, P2). Other advantages may become apparent in view of the description provided above.

Figure 4:
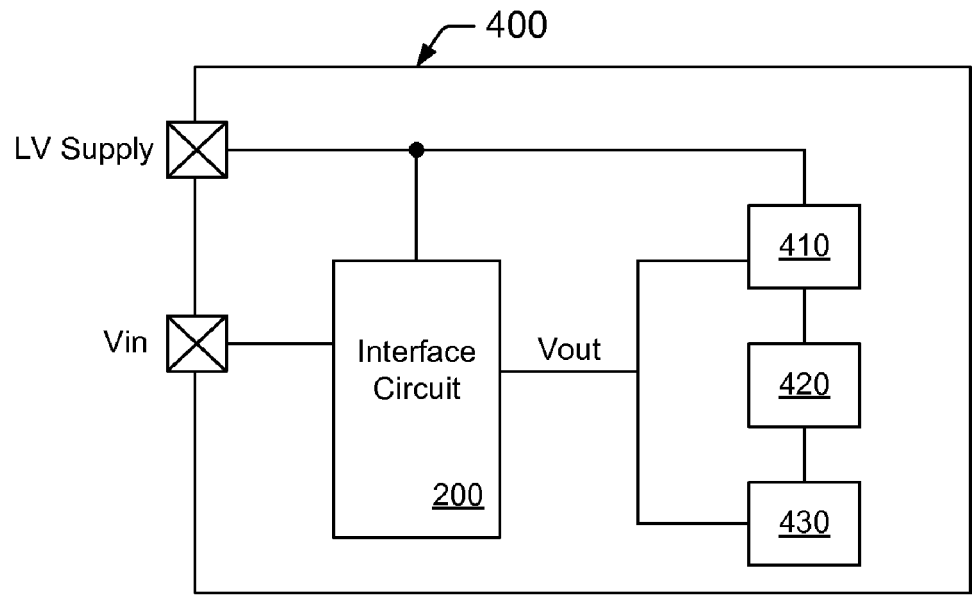
FIG. 4 is a block diagram of an integrated circuit comprising the interface circuit design of FIG. 2.

In some cases, the interface circuit described herein may be arranged within the input and/or output circuitry of an integrated circuit (IC), as shown in FIG. 4. For example, the interface circuit (200) may be arranged on a periphery of the IC (400) for converting the relatively high input signal (Vin) into a relatively low output signal (Vout) before the output signal is supplied to one or more IC components (410-430). It should be noted, however, that the interface circuit described herein is not limited to signal translation between ICs, and may be used wherever signal translation is typically performed.

Figure 5:
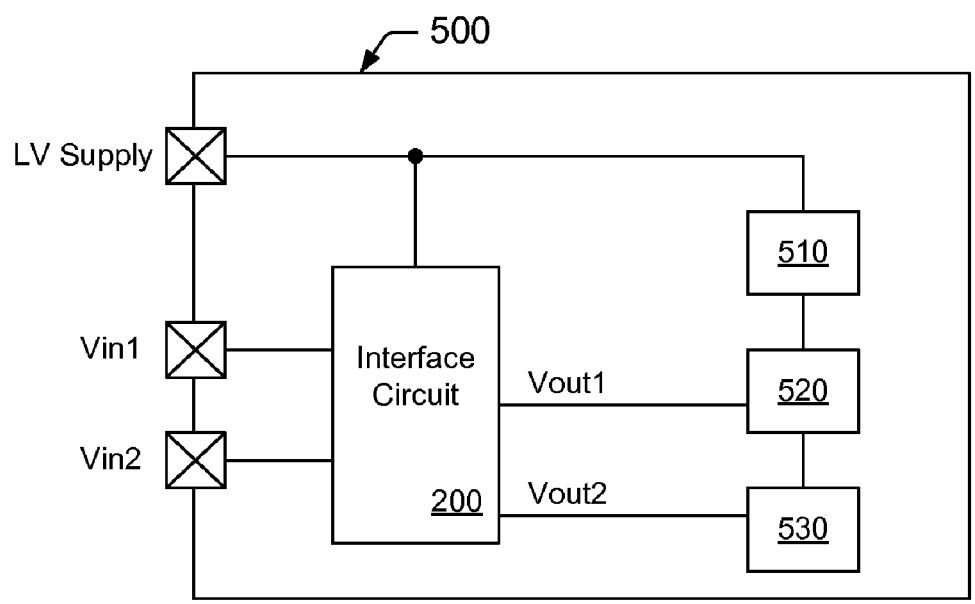
FIG. 5 is a block diagram of another integrated circuit comprising the interface circuit design of FIG. 2.
Figure 6:
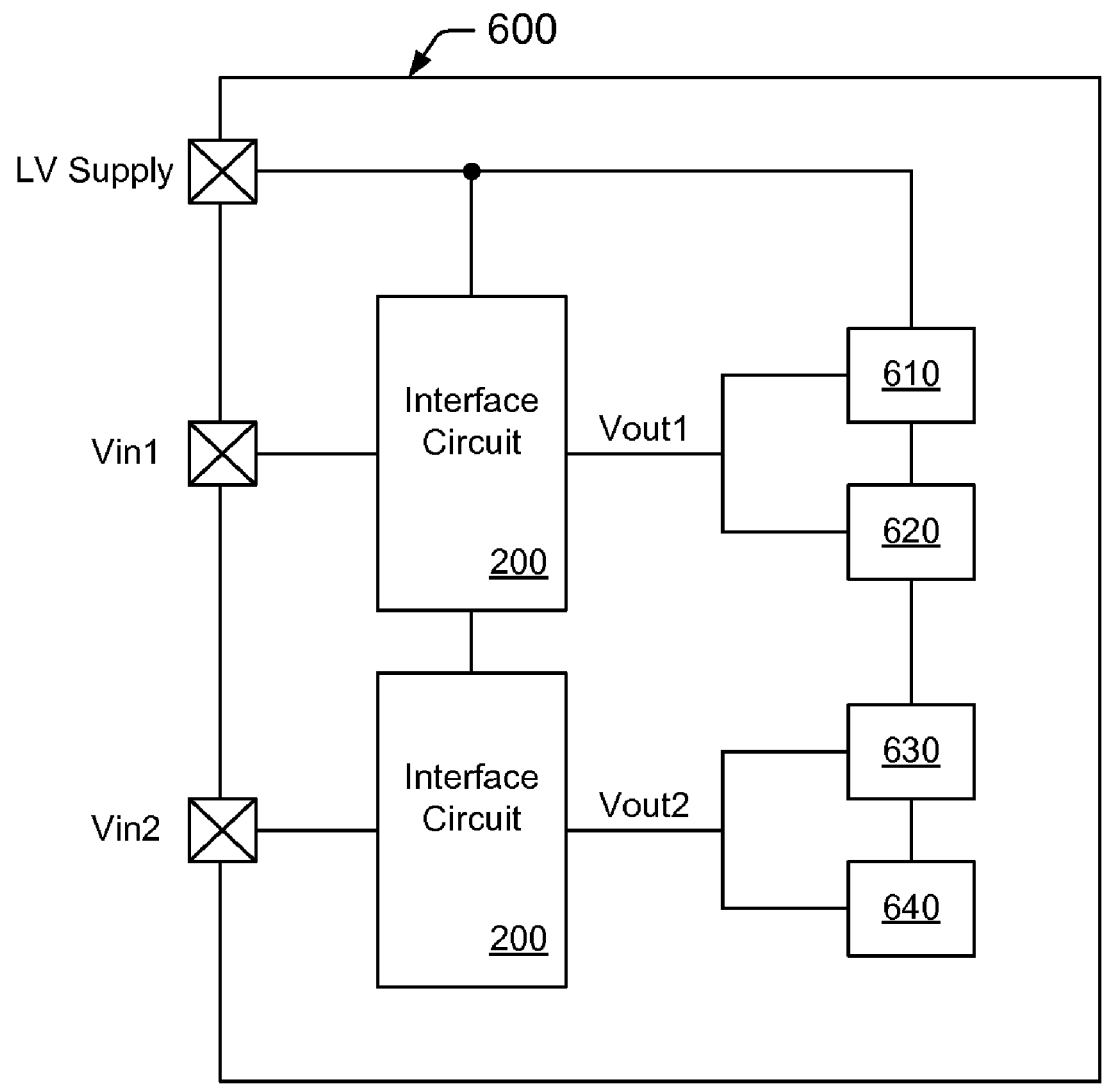
FIG. 6 is a block diagram of yet another integrated circuit comprising the interface circuit design of FIG. 2.

In some cases, the interface circuit described herein could be used to translate between multiple signal levels, as shown in FIGS. 5 and 6. For example, the interface circuit (200) may be arranged on a periphery of the IC (500) for converting a plurality of high voltage input signals (e.g., Vin1, Vin2) into a plurality of respective low voltage output signals (e.g., Vout1, Vout2) before the output signals are supplied to one or more IC components (e.g., 520, 530). Such an embodiment in illustrated, for example, in FIG. 5. In other cases, multiple interface circuits (200) could be used for converting each of the high voltage input signals (e.g., Vin1, Vin2) into respective low voltage output signals (e.g., Vout1, Vout2) before the output signals are supplied to one or more IC components (e.g., 610, 620, 630, 640). Such an embodiment is illustrated, for example, in FIG. 6.

It will be appreciated to those skilled in the art having the benefit of this disclosure that this invention is believed to provide an improved interface circuit, which functions to translate a high voltage signal into a low voltage signal without the use of high voltage transistors or a high voltage power supply. Further modifications and alternative embodiments of various aspects of the invention will be apparent to those skilled in the art in view of this description.

For example, those skilled in the art will recognize that current sense amplifiers may be implemented in a variety of different ways. Although a particular ISA design is shown in FIG. 2 and described herein, the interface circuit described herein is not limited to the particular ISA design shown. Instead, the improved interface circuit may include substantially any appropriately configured ISA design. For example, alternative ISA designs may provide the desired clamping voltages without necessarily including cross-coupled transistors P3 and P4. In other words, an alternative ISA design may provide a near zero input impedance without relying on the high transconductance of PMOS transistors P3 and P4.

In addition to alternative ISA designs, the improved interface circuit may be alternatively configured for translating between substantially different signal levels, in accordance with substantially different interface standards. The improved interface circuit may also be implemented with alternative process technologies (e.g., any CMOS process technology), in other embodiments of the invention. Although described for use primarily within the input/output (I/O) circuitry of an integrated circuit (IC), the interface circuit described herein may also be used for translating internal signal levels within an IC, or for translating signal levels between other circuits, systems or devices. It is intended, therefore, that the following claims be interpreted to embrace all such modifications and changes and, accordingly, the specification and drawings are to be regarded in an illustrative rather than a restrictive sense.

What is claimed is:

1. An interface circuit configured for translating a relatively high input voltage into a relatively low output voltage, the interface circuit comprising:
    a pair of input transistors having sources that are coupled together for receiving a relatively low voltage from a power supply, wherein a gate of a first one of the pair of input transistors is coupled for receiving the relatively high input voltage and wherein a gate of a second one of the pair of input transistors is coupled for receiving a reference voltage different from the relatively high input voltage; and
    a current sense amplifier having a pair of input terminals, each coupled to a drain of a different one of the pair of input transistors to receive a pair of differential currents and to generate a pair of differential voltages, wherein the current sense amplifier is configured to clamp gate-drain voltages of the pair of input transistors to a level that reduces stress on gate insulators of the pair of input transistors.

2. The interface circuit as recited in claim 1, further comprising a voltage sense amplifier configured to receive the pair of differential voltages from the current sense amplifier and to generate the relatively low output voltage therefrom.

3. The interface circuit as recited in claim 1, wherein a gate of a second one of the pair of input transistors is configured to receive a complementary version of the relatively high input signal.

4. The interface circuit as recited in claim 1, wherein the current sense amplifier comprises a plurality of transistors, two of which include cross-coupled gates and drains.

5. The interface circuit as recited in claim 4, wherein the cross-coupled transistors include sources configured to receive the pair of differential currents and include drains at which the pair of differential voltages are generated.

6. The interface circuit as recited in claim 4, further comprising a pair of pull-up transistors, each with a source coupled to the power supply and a drain coupled to a drain of a different one of the cross-coupled transistors.

7. The interface circuit as recited in claim 6, wherein the pair of input transistors, the plurality of transistors and the pair of pull-up transistors each comprise low voltage transistors configured for operating within a low voltage range.

8. The interface circuit as recited in claim 7, wherein the low voltage range comprises a range of values between about 0.0V and about 1.8V.

9. The interface circuit as recited in claim 7, wherein the relatively low voltage from the power supply falls within a first range of values between about 0.0V and about 1.45V, and wherein the relatively high input voltage falls within a second range of values between about 1.45V and about 1.8V.

10. A circuit comprising:
    an interface circuit configured to convert a first signal level into a substantially lower second signal level, wherein the interface circuit comprises:
        a pair of input transistors configured to operate at or below the second signal level, one of the pair of input transistors is coupled for receiving an input signal at the first signal level, the other one of the pair of input transistors is coupled for receiving a reference voltage signal different from the input al at the first signal level;
        a current sense amplifier coupled to the pair of input transistors to generate a pair of differential signals based on the input signal and the other signal received by the pair of input transistors, wherein the current sense amplifier includes a pair of cross-coupled transistors having (a) drains coupled to ground by load transistors and (b) gates coupled to ground, to clamp gate-drain voltages of the pair of input transistors to a level that reduces stress on gate insulators of the pair of input transistors; and
        a voltage sense amplifier coupled to the current sense amplifier to convert the pair of differential signals into an output signal at the second signal level; and
    a plurality of circuit components, at least one of which is coupled to the interface circuit to receive the output signal at the second signal level.

11. The circuit as recited in claim 10, wherein the interface circuit is coupled for receiving only one power supply voltage, which is less than or equal to about 1.45V.

12. The circuit as recited in claim 11, wherein the pair of input transistors and the current sense amplifier comprise only low voltage transistors configured for operating within a low voltage range of about 0.0V to about 1.45V.

13. The circuit as recited in claim 12, wherein the pair of input transistors and the current sense amplifier comprise only p-channel metal oxide semiconductor (PMOS) transistors.

14. The circuit as recited in claim 10, wherein the signal levels generated at drains of the pair of input transistors are determined by a width and/or length of the pair of cross-coupled transistors.

15. The circuit as recited in claim 10, wherein the signal levels generated at drains of the input transistors are limited to about 1.0V and above.

16. The circuit as recited in claim 10, wherein the interface circuit is arranged on a periphery of an integrated circuit.

17. The interface circuit as recited in claim 1, wherein the current sense amplifier includes a pair of cross coupled transistors having drains coupled to ground by grounded gate load transistors, to clamp the gate-drain voltages of the pair of input transistors to the stress reducing level.

18. An integrated circuit comprising first and second interface circuits as recited in claim 10, the first and second interface circuits arranged on a periphery of the integrated circuit, the first interface circuit configured to receive a first input signal and the second interface circuit configured to receive a second input signal, wherein different ones of the plurality of circuit components are configured to receive output signals from an individual one of the first and second interface circuits.

* * * * *